(12) United States Patent
Kim et al.

(10) Patent No.: US 7,269,041 B2
(45) Date of Patent: Sep. 11, 2007

(54) MULTI-PORT MEMORY DEVICE

(75) Inventors: Kyung-Whan Kim, Kyoungki-do (KR); Jae-Jin Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/322,508

(22) Filed: Dec. 30, 2005

(65) Prior Publication Data

US 2006/0227647 A1    Oct. 12, 2006

(30) Foreign Application Priority Data

Apr. 8, 2005    (KR) .................. 10-2005-0029437

(51) Int. Cl.
*G11C 5/02* (2006.01)
(52) U.S. Cl. .................. 365/51; 365/63; 365/230.05
(58) Field of Classification Search .............. 365/51, 365/63, 230.05
See application file for complete search history.

(56) References Cited

U.S. PATENT DOCUMENTS

| | | | |
|---|---|---|---|
| 5,818,821 A * | 10/1998 | Schurig | ............ 370/293 |
| 6,262,594 B1 * | 7/2001 | Cheung et al. | ............ 326/38 |
| 6,643,787 B1 | 11/2003 | Zerbe et al. | |
| 6,681,353 B1 | 1/2004 | Barrow | |
| 6,914,847 B1 | 7/2005 | Park | |
| 2005/0047255 A1 | 3/2005 | Park et al. | |
| 2005/0135158 A1 | 6/2005 | Park | |
| 2005/0141322 A1 * | 6/2005 | Park | ............ 365/230.03 |

FOREIGN PATENT DOCUMENTS

| | | |
|---|---|---|
| KR | 2003-0092375 | 12/2003 |
| KR | 2003-0094697 | 12/2003 |

* cited by examiner

*Primary Examiner*—Michael T Tran
(74) *Attorney, Agent, or Firm*—Blakely Sokoloff Taylor & Zafman

(57) ABSTRACT

A multi-port memory device that prevents degradation of efficiency of a global data drive by turning off the switches, which do not discharge a global data bus. The multi-port memory device includes a global data bus, a banks, each bank including a transmitter and a receiver; ports, each port including a transmitter and a receiver; switches that operate to selectively connect the receivers of the banks and ports to the global data bus; and a switch signal generator for generating a switch signal in response to data drive pulses inputted to the transmitters of the banks and the ports.

19 Claims, 17 Drawing Sheets

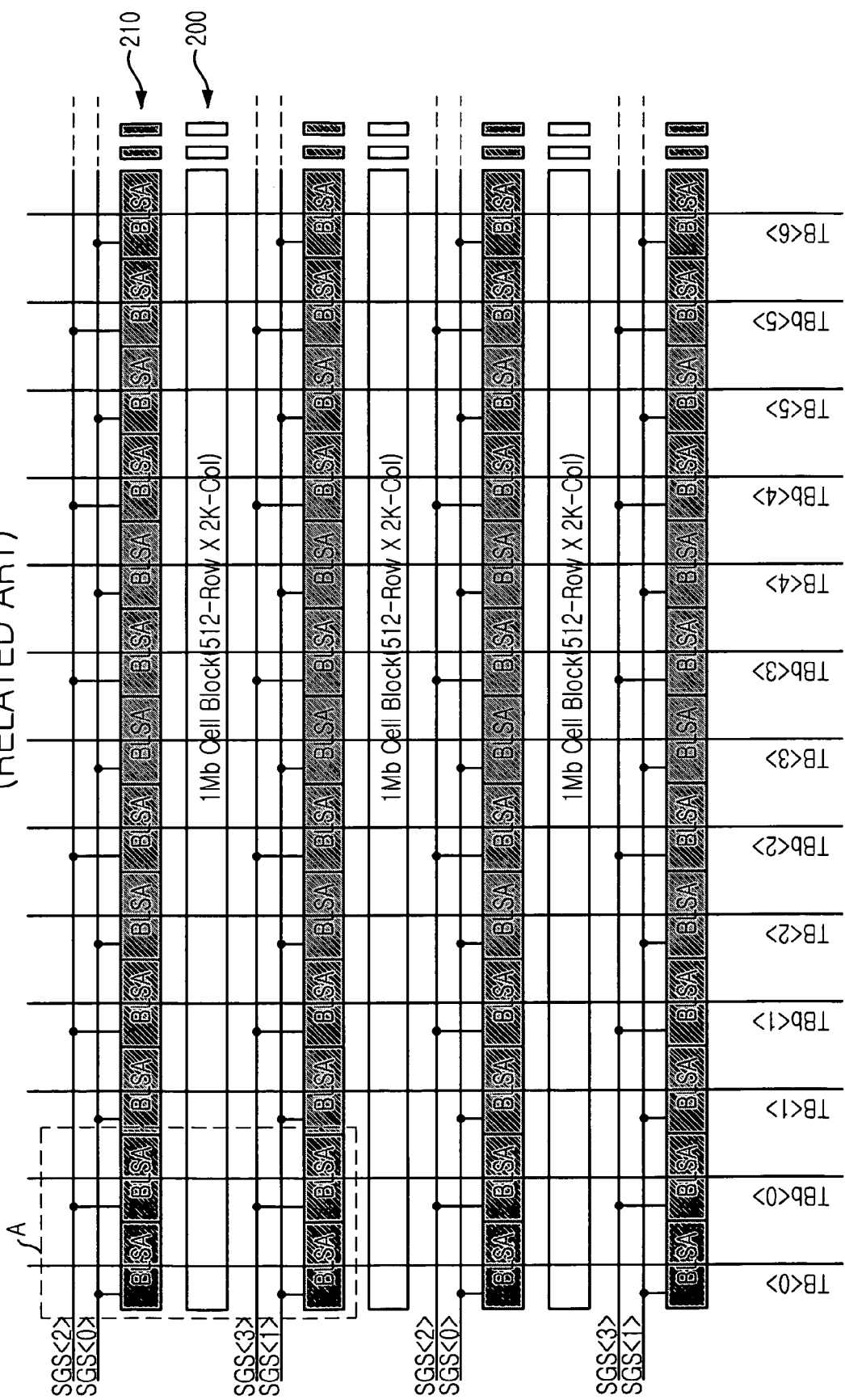

FIG. 12
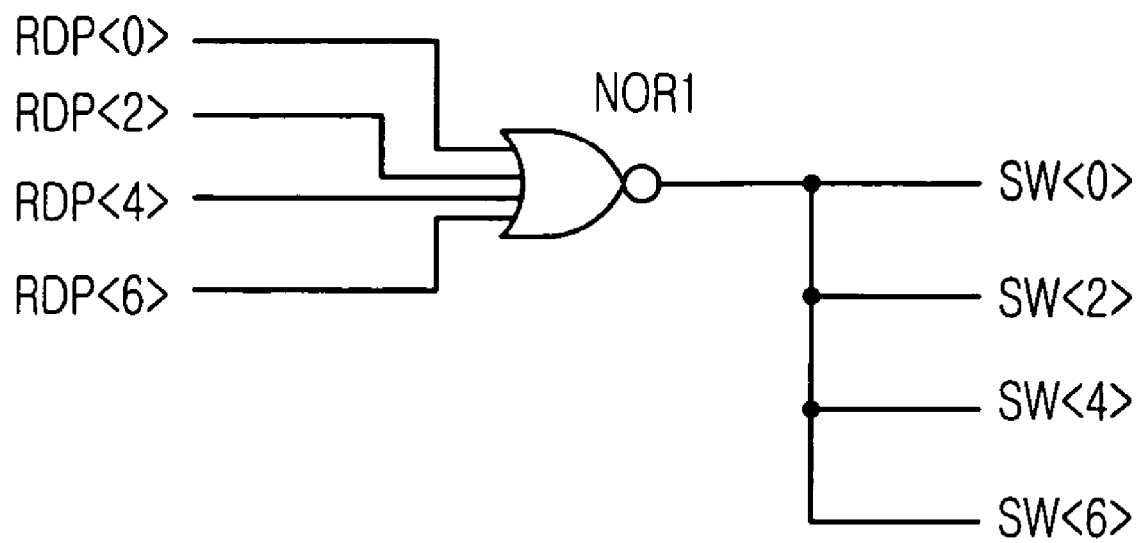
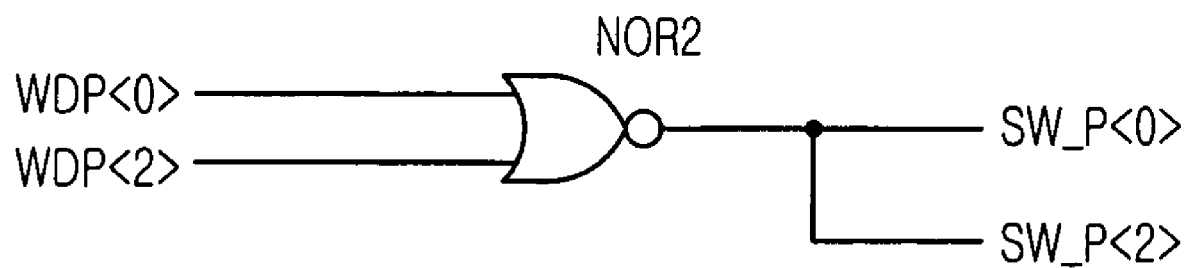

MULTI-PORT MEMORY DEVICE

FIELD OF THE INVENTION

The present invention relates to a multi-port memory device, and, more particularly, to a multi-port memory device for performing effective data transmission.

DESCRIPTION OF RELATED ARTS

Most memory devices including DRAM contain a single port for exchanging data with a chipset. Herein, the single port usually includes a plurality of I/O pin sets. Meanwhile, a functional classification of the chipset and the memory device becomes more ambiguous. Therefore, it is seriously considered by designers to integrate the memory device and the chipset. In order to satisfy the integration, a multi-port memory device for directly exchanging data with peripheral devices such as a graphic device and a CPU is required. For implementing the multi-port memory device, every port in the multi-port memory device has to access every memory cell in the multi-port memory device.

FIG. 1 is a block diagram describing a 256M multi-port memory device disclosed in a commonly owned co-pending application, U.S. Ser. No. 10/750,156, filed on Dec. 31, 2003, entitled "MULTI-PORT MEMORY DEVICE", which is incorporated herein by reference.

As shown, the 256M multi-port memory device includes a plurality of banks BANK0 to BANK15, a plurality of row decoders RDEC, a controller 100, a plurality of ports PORT0 to PORT7, four global data buses GIO_LU, GIO_RU, GIO_LD, and GIO_RD, first and second global data bus connectors PR_U and PR_D, a plurality of transfer buses TBs, a plurality of transfer bus connectors TGs, a plurality of bus connectors TLs, and a plurality of data transfer units QTRXs.

Each of the banks BANK0 to BANK15 includes an 8K_2K DRAM, i.e., 16M DRAM, the row decoder RDEC, and a core circuit, such as a sense amplifier and an equalizer, which are necessary for general DRAM core area. Every four banks of the banks BANK0 to BANK15 are arranged in a row at a corresponding quadrant dividing the core area into four. In the concrete, there are included BANK0, BANK2, BANK4, and BANK6 in a first quadrant placed in an upper left side of the core area. BANK8, BANK10, BANK12, and BANK14 are in a second quadrant placed in an upper right side of the core area. BANK1, BANK3, BANK5, BANK7 are in a third quadrant placed in a lower left side of the core area. BANK9, BANK11, BANK13, and BANK15 are in a fourth quadrant placed in a lower right side of the core area. Meanwhile, it is advisable to arrange the two row decoders RDEC between each neighboring bank in the same quadrant. Further, a column of the banks BANK0 to BANK15 is divided into four segments. Thus, each of the four segments is constituted with 512 cells.

The controller 100 generates an internal command signal, an internal address signal, and a control signal to control an operation of the memory device. The internal command signal includes an internal active command signal ACT, an internal precharge command signal PCG, an internal read command signal RD, and an internal write command signal WD. The internal address signal includes an active array address AAA, a precharge array address PAA, a read array address RAA, a write array address WAA, a row address RA, a read segment address RSA, and a write segment address WSA. The control signal includes transfer gate control signal TGC, a port/pipe register flag signal PRFG, a port/pipe register data driving signal DP, and a DRAM core test mode flag signal DTM.

The ports PORT0 to PORT7 are placed at the margin of a die. Every two ports of the ports PORT0 to PORT7 are arranged in each of the quadrants. In detail, PORT0 and PORT2 are in the first quadrant; PORT4 and PORT6 are in the second quadrant; PORT1 and PORT3 are in the third quadrant; PORT5 and PORT7 are in the fourth quadrant. Each of the ports PORT0 to PORT7 supports a serial I/O interface and communicates independently with a different target device such as a graphic chip. When the ports PORT0 to PORT7 support the serial I/O interface, every port has a plurality of pads corresponding to data, commands, and addresses, a plurality of pad buffers for buffering a signal transmitted to the pads, a decoder for decoding data to be transmitted, an encoder for encoding received data, and data transformer for transforming the serial received data into parallel data or transforming the parallel data into serial data.

The first to fourth global data buses GIO_LU, GIO_RU, GIO_LD, and GIO_RD are placed between the bank and the port of the corresponding quadrants, respectively. In detail, the first global data bus GIO_LU is in the first quadrant; the second global data bus GIO_RU is in the second quadrant; the third global data bus GIO_LD is in the third quadrant; the fourth global data bus GIO_RD is in the fourth quadrant. The four global data buses GIO_LU, GIO_RU, GIO_LD, and GIO_RD are 512-bit bidirectional data buses coupled to the banks and the ports of the corresponding quadrant and the first and the second global data bus connectors PR_U and PR_D.

Herein, the first global data bus GIO_LU and the second global data bus GIO_RU are connected through the first global data bus connector PR_U. The third global data bus GIO_LD and the fourth global data bus GIO_RD are connected through the second global data bus connector PR_D. The first and second global data bus connector PR_U and PR_D include 512 numbers of bidirectional pipe registers corresponding to the 512-bit global data buses.

The transfer bus TB is a local data bus connecting a bit line sense amplifier and the bus connectors TL of the corresponding bank. The number of lines of the transfer bus TB corresponds to the number of cells in one segment, e.g., 512. The transfer bus TB is implemented with a differential bus.

The transfer bus connector TG is implemented with a plurality of MOS transistors. The number of the MOS transistors corresponds to the number of lines of the transfer bus TB. Because the transfer bus TB is the differential bus, one transfer bus connector TG is implemented with 512 pairs of MOS transistors. Accordingly, the transfer bus connector TG is called a transfer gate.

One set of transfer latch is formed with 512 numbers of transfer latches. The bus connector TL includes 16 sets of transfer latches. Each transfer latch includes a first bus connecting circuit for a read operation and a second bus connecting circuit for a write operation. Herein, the first bus connecting circuit corresponds to an I/O sense amplifier of DRAM and includes a read sense amplifier for sensing and latching a read data on the transfer bus TB and a read driver for driving the latched read data into the global data bus of the corresponding quadrant. Further, the second bus connecting circuit corresponds to a write driver of DRAM and includes a write latch for sensing and latching write data on the global data bus and a write driver for driving write data into the transfer bus TB.

The data transfer unit QTRX includes 512 numbers of transmitters QTX for transmitting write data inputted to a corresponding port and 512 receivers QRX for receiving a read data inputted from the global data bus to transmit to a corresponding port.

Although not shown in FIG. 1, the 256M multi-port DRAM further includes a voltage generator, test logic, and various pads, including a clock pad. The voltage generator placed at the margin of the 256M multi-port DRAM receives an external voltage to generate an internal voltage. The test logic is arranged between the ports corresponding to the first quadrant and the second quadrant and arranged between the ports corresponding to the third quadrant and the fourth quadrant. The pads are also placed at the margin of the 256M multi-port DRAM.

Further, each of the quadrants includes command lines for receiving the internal command signals and 2-bit address lines for receiving the internal address lines. The command lines and the address lines deliver signals from the controller 100 to the banks BANK0 to BANK15. At each of the left and right side of the controller 100, a 4-bit transfer gate control line TGC<0:3> connects the controller 100 to the transfer bus connector TG.

FIG. 2 is a block diagram showing a relationship between the transfer bus and the segment, i.e., a column unit of the 256M multi-port DRAM shown in FIG. 1.

As shown, the 256M multi-port DRAM includes a memory cell array 200 and a bit line sense amplifier array 210. Referring to a block denoted as A, one transfer bus pair TB<0> and TBb<0> of the memory cell array 200 are connected to four bit line sense amplifiers BLSA arranged upper and lower side of the memory cell array 200. The four bit line sense amplifier BLSA are controlled by a segment select signal SGS<0:3>, respectively. Herein, the segment select signal SGS corresponds to a column select signal Yi of the conventional DRAM. In case of a 2K column, when a predetermined row and a predetermined segment are selected at the same time, 512 cells are selected and data of the 512 cells are transferred into the 512-bit transfer bus TB<0:511> corresponding to the 512 cells.

Each of the transfer buses TB in the first quadrant is connected to a corresponding transfer bus TB in the third quadrant through the transfer gate TG. Herein, one set of the transfer gate is constituted with 512 transfer gates TG and eight sets of transfer gates TG are provided in the 256M multi-port DRAM. That is, the transfer gate is placed between two transfer buses TB, each corresponding to two banks arranged in the same column to selectively connect the two transfer buses TB to each other. The transfer gate control signal TCG for controlling the transfer gate TG is generated in the controller 100.

Hereinafter, an operation of the 256M multi-port DRAM is explained.

FIGS. 3A and 3B are block diagrams describing a normal read path and a normal write path of the 256M multi-port DRAM, respectively.

Herein, the normal read and write paths refer to data paths of the read and the write operations that occurred in the same quadrant. For example, in the case of the normal read and write paths, the commands and addresses for the read or write operation inputted through a port in the first quadrant, i.e., the first port PORT1 or the third port PORT2, are only able to access the memory cells in the first quadrant.

As shown in FIG. 3A, when the 256M multi-port DRAM reads 512-bit read data from a predetermined segment in the first bank BANK0 through the first port PORT0, the commands and addresses relating to the read operation are inputted to the controller 100 in a form of a packet through the first port PORT0. The controller 100 generates the internal active command signal ACT, the active array address AAA, and the row address RA corresponding to the first bank BANK0 to activate a predetermined row, i.e., a word line WL, in the first bank BANK0. Then, the controller 100 generates the read command signal RD, the read array address RAA, and read segment address RSA corresponding to the first bank BANK0. The bit line sense amplifier BLSA senses and amplifies the 512-bit read data of a segment corresponding to the read segment address RSA to transfer the 512-bit read data to the pair of transfer buses TB and TBb.

Meanwhile, the bus connector TL of the first bank BANK0 senses the 512-bit read data loaded on the pair of transfer buses TB and TBb and, then, transmits the 512-bit read data to the first global data bus GIO_LU. Subsequently, the 512-bit read data transmitted to the first global data bus GIO_LU is buffered in a read buffer of the first port PORT0 after passing through the receiver QRX of the data transfer unit QTRX corresponding to the first port PORT0. The 512-bit read data in read buffer is transformed to packets of a predetermined size and serially transmitted to a target device connected to the first port PORT0.

Next, the controller 100 generates the internal precharge command signal PCG and the precharge array address PAA to inactivate the word line WL. The transfer bus connector TG corresponding to the internal precharge command signal PCG and the precharge array address PAA is switched-off. Therefore, the transfer bus pair TB and TBb of the first bank BANK0 and the transfer bus pair TB and TBb of the second bank BANK1 are disconnected. Herein, in FIG. 3A, BL and BLb denote a bit line pair; T denotes a cell transistor; and C denotes a cell capacitor.

Hereinafter, a case in which the 256M multi-port DRAM writes 512-bit write data to a predetermined segment in the first bank BANK0 through the first port PORT0 is explained by referring FIG. 3B.

As shown, after the commands and addresses relating to the write operation and the 512-bit write data are inputted to the controller 100 in packet form through the first port PORT0, the controller 100 generates the internal active command signal ACT, the active array address AAA, and the row address RA corresponding to the first bank BANK0 to activate a predetermined row, i.e., a word line WL, in the first bank BANK0. Then, the controller 100 generates the internal write command signal WD, the write array address WAA, and the write segment address WSA corresponding to the first bank BANK0.

The 512-bit write data buffered in a write buffer of the first port PORT0 is written to the segment corresponding to the write segment address WSA in accordance with a scheduling of the controller 100. That is, the 512-bit write data transformed into parallel data is loaded to the first global data bus GIO_LU through the transmitter QTX of the data transfer units QTRX. Then, the 512-bit write data is loaded to the pair of transfer buses TB and TBb after passing through the bus connector TL of the first bank BANK0. Subsequently, the 512-bit write data loaded in the pair of transfer buses TB and TBb is stored in 512 numbers of memory cells, i.e., the segment, by the bit line sense amplifier BLSA corresponding to the write segment address WSA.

Finally, the controller 100 generates the internal precharge command signal PCG and the precharge array address PAA to inactivate the word line.

FIGS. 4A and 4B are block diagrams describing a cross read path and a cross write path of the 256M multi-port DRAM, respectively.

Herein, the cross read and write paths refer to data paths of the read and the write operations that occur between different quadrants, respectively. For example, in the case of the cross read and write paths, it is possible to access the memory cells in the third quadrant for the commands, addresses, and data inputted through the first port PORT0 in the first quadrant.

As shown in FIG. 4A, when the 256M multi-port DRAM reads 512-bit read data of a predetermined segment in the first bank BANK0 through the second port PORT1, all of the operations are similar to that of the case of the normal read path. However, the transfer bus connector TG coupled between the first and the second banks BANK0 and BANK1 is switched-on and, therefore, the pair of the transfer buses TB and TBb of the first bank BANK0 and the pair of the transfer buses TB and TBb of the second bank BANK1 are connected to each other. The 512-bit read data is loaded to the transfer bus pair TB and TBb of the second bank BANK1 and transmitted to a target device after passing through the bus connectors TL connected to the second bank BANK1, the third global data bus GIO_LD, the data transfer unit QTRX connected to the second port PORT1, and the second port PORT1.

Next, the case where the 256M multi-port DRAM writes a 512-bit write data to a predetermined segment in the first bank BANK0 through the second port PORT1 is explained, referring to FIG. 4B.

As shown, all of the operations are similar to that of the normal write path. However, the transfer bus connector TG coupled between the first and the second banks BANK0 and BANK1 is switched-on; and, therefore, the transfer bus pair TB and TBb of the first bank BANK0 and the pair of the transfer bus TB and TBb of the second bank BANK1 are connected. In this case, the 512-bit write data inputted through the second port PORT1 is loaded on the transfer bus pair TB and TBb of the first bank BANK0 after passing through the data transfer unit QTRX connected to the second port PORT1, the third global data bus GIO_LD, the bus connectors TL connected to the second bank BANK1. The process thereafter is the same as that of the normal write.

Meanwhile, when the data is transmitted between the first and the second global data buses GIO_LU and GIO_RU, the first and the second global data buses GIO_LU and GIO_RU are connected via the first global data bus connector PR_U. Further, when the data is transferred between the third and the fourth global data buses GIO_LD and GIO_RD, the third and the fourth global data buses GIO_LD and GIO_RD are connected through the second global data bus connector PR_D.

As previously mentioned, every port PORT0 to PORT7 in the conventional 256M multi-port memory device can access every segment in the conventional 256M multi-port memory device. Further, because each of the ports PORT0 to PORT7 accesses the segment independently, the segment can be concurrently accessed by plural ports PORT0 to PORT7 as long as each of the four global buses GIO_LU to GIO_RD are not used concurrently. Moreover, the data is inputted or outputted serially between the ports PORT0 to PORT7 and the target device and the 512-bit data is processed in a parallel manner between the ports PORT0 to PORT7 and each quadrant of the core area.

FIG. 5 is a diagram showing a data transmitting structure of the 256M multi-port DRAM shown in FIG. 1.

As shown, the 256M multi-port DRAM includes a global data bus GIO for use in exchanging data between an input/output interface, i.e., a port and a memory cell block, i.e., a bank. Further, the 256M multi-port DRAM also includes data transfer units QTRX for receiving or transmitting data between the global data bus GIO and the port and bus connectors TL for receiving or transmitting data between the global data bus GIO and the bank.

FIG. 6 is a block diagram describing a structure of the global data bus GIO shown in FIG. 5.

As shown, the 256M multi-port DRAM is divided into four quadrants QUADRANT_LU, QUADRANT_RU, QUADRANT_LD, and QUADRANT_RD. Each of the four quadrants has the same structure and operates independently.

Looking at the first quadrant QUADRANT_LU, the first global data bus GIO_LU is connected to four banks BANK0, BANK2, BANK4, and BANK6, two ports PORT0 and PORT2, and the first global data bus connector PR_U. That is, seven blocks are connected to one global data bus. When global data is shared by several blocks, the load of the global data increases and a data interference occurs.

FIG. 7 is a block diagram showing a worst read case and a worst write case of the 256M multi-port DRAM shown in FIG. 1.

As shown, a single global data bus is provided with 512 bus lines and is formed with a hierarchical wiring structure. That is, a first metal wire and a second metal wire are provided for vertical and horizontal bus lines, respectively. Generally, a resistance of the first metal wire for the vertical bus line is higher than the resistance of the second metal wire for the horizontal bus line.

Meanwhile, the length of the first metal wires connected to a single bank are different from one another. Therefore, the loading value of each bus line becomes different. The loading value also can be varied depending on a data transmit path as well as the difference of the length of the first metal wire. For example, the data transmit path between the first port PORT0 and the seventh bank BANK6 is the longest path in FIG. 7. Therefore, the loading value between the first port PORT0 and the seventh bank BANK6 has the largest value and, thus, the read or write operation occurring between the first port PORT0 and the seventh bank BANK6 becomes the worst read or write case.

As previously mentioned, the 256M multi-port DRAM includes the 512-bit global data bus. When the number of the bus lines in the global data bus is more than 64-bits, a great amount of a current is consumed.

In order to reduce the problem caused by the great current consumption of the wide band global data bus, the applicant of the present application proposes a global data bus structure using a current sense method instead of a voltage drive method in U.S. Ser. No. 10/788,704.

FIG. 8 is a block diagram describing a data transfer unit QTRX and bus connector TL disclosed in a commonly owned co-pending application, U.S. Ser. No. 10/788,704, filed on Feb. 27, 2004, entitled "SEMICONDUCTOR MEMORY DEVICE", which is incorporated herein by reference.

As shown, the bus connector TL and the data transfer unit QTRX are connected through the global data bus GIO.

A receiver RX of the bus connector TL is provided with two PMOS transistors P1 and P2, three NMOS transistors N1, N2, and N9. First terminals of the first PMOS transistor P1 and the second PMOS transistor P2 are connected to a power voltage source VDD. A second terminal and a gate of the first PMOS transistor P1 are diode-connected to each other. A second terminal of the second PMOS transistor P2 is connected to a first output terminal. A first terminal of the first NMOS transistor N1 is connected with the second terminal of the first PMOS transistor P1 at node A1. A second terminal of the first NMOS transistor N1 is connected to the global data bus GIO. The first NMOS transistor N1 and the second NMOS transistor N2 receive a reference voltage VR through gates. A first terminal of the second NMOS transistor N2 is connected to the first output terminal. The ninth NMOS transistor receives an evaluation signal EVAL1 through a gate. A first terminal of the ninth transistor N9 is connected to a second terminal of the second NMOS transistor N2; and the second terminal of the ninth transistor N9 is connected to the ground voltage VSS.

A transmitter TX of the bus connector TL is connected between a ground voltage VSS and the global data bus GIO and includes two NMOS transistors N5 and N6. The fifth NMOS transistor N5 receives a first data TX1 through a gate; the sixth NMOS transistor N6 receives a first drive pulse DP1 through a gate.

The receiver QRX of the transfer unit QTRX is provided with two PMOS transistors P3 and P4, three NMOS transistors N3, N4, and N10. First terminals of the third PMOS transistor P3 and the fourth PMOS transistor P4 are connected to the power voltage source VDD. A second terminal and a gate of the third PMOS transistor P3 are diode-connected to each other. A second terminal of the fourth PMOS transistor P4 is connected to a second output terminal. A first terminal of the third NMOS transistor N3 is connected with the second terminal of the third PMOS transistor P3 at node A2. A second terminal of the third NMOS transistor N3 is connected to the global data bus GIO. The third NMOS transistor N3 and the fourth NMOS transistor N4 receive the reference voltage VR through their gates. A first terminal of the fourth NMOS transistor N4 is connected to the second output terminal. The tenth NMOS transistor N10 receives a second evaluation signal EVAL2 through a gate. A first terminal of the tenth transistor N10 is connected to a second terminal of the fourth NMOS transistor N4; and a second terminal of the tenth transistor N10 is connected to the ground voltage VSS.

A transmitter QTX of the transfer unit QTRX is connected between the ground voltage VSS and the global data bus GIO and includes two NMOS transistors N7 and N8. The seventh NMOS transistor N7 receives a second data TX2 through a gate; the eighth NMOS transistor N8 receives a second drive pulse DP2 through a gate.

The global data bus GIO, though actually implemented with a long metal wire, can be modeled with a resister R and a capacitor C, which have equivalent value with the metal wire.

When the read operation RD is performed, data is transmitted between the transmitter TX of the bus connector TL and the receiver QRX of the data transfer unit QTRX through the global data bus GIO. Meanwhile, when the write operation WT is performed, the data is transmitted between the transmitter QTX of the data transfer unit QTRX and the receiver RX of the bus connector TL through the global data bus GIO.

As previously mentioned, the read and write operations are performed in a way that the transmitters TX and QTX charge or discharge the global data bus GIO in response to the first and the second data TX1 and TX2 and, then, the receivers RX and QRX sense the status of the global data bus GIO.

FIG. 9 is a waveform showing the read operation of the circuit shown in FIG. 8.

The first drive pulse DP1, synchronized with a clock, makes the first data TX1, activated into a logic level 'H', loaded into the global data bus GIO. The second evaluation signal EVAL2 is activated into a logic level 'H' after a predetermined time has passed since the first drive pulse DP1 is activated to evaluate the first data TX1 loaded into the global data bus GIO. Herein, the predetermined time is a time margin for charging or discharging the global data bus GIO.

If first data TX1 inputted to the transmitter TX of the bus connector TL and the first drive pulse DP1 are the logic level 'H', the fifth and sixth NMOS transistors N5 and N6 are turned on and, therefore, the global data bus GIO is discharged. After a voltage level of the node A2 in the receiver QRX of the data transfer unit QTRX becomes lower than a threshold voltage VTH of the PMOS transistor, the third and fourth PMOS transistors P3 and P4 are turned on and, thus, an output DATA2 from the receiver QRX of the data transfer unit QTRX becomes a logic level 'H'. That is, the first data TX1 having the logic level 'H' is correctly transmitted through the global data bus GIO.

Meanwhile, because a size of the fourth PMOS transistor P4 is relatively larger than that of the tenth NMOS transistor N10, the output signal DATA2 does not change into a logic level 'L' but shows a little fluctuation when the second evaluation signal EVAL2 is the logic level 'H'.

If the first data TX1 with a logic level 'L' is inputted to the transmitter TX of the bus connector TL, and the first drive pulse DP1 is the logic level 'H', the global data GIO maintains a charged state. Therefore, the node A2 in the data transfer unit QTRX is not discharged and, subsequently, the fourth PMOS transistor P4 cannot drive the second output terminal into a logic level 'H'. Then, when the second evaluation signal EVAL2 becomes the logic level 'H', the tenth NMOS transistor N10 is turned on and, therefore, the second output terminal is discharged. Thus, the output signal DATA2 outputted from the data transfer unit QTRX is a logic level 'L'. That is, the first data TX1 having the logic level 'L' is correctly transmitted through the global data bus GIO.

Referring to FIG. 9, the first drive pulse DP1 is activated four times as the logic level 'H'. Namely, the first data TX1 is transmitted four times. In other words, the global data bus GIO is discharged only while the drive pulses DP1 and DP2 are in the logic level 'H'. The global bus GIO is charged through the receiver RX in the bus connector TL and the receiver QRX in the data transfer unit QTRX. Because the first and the third NMOS transistors N1 and N3 receive the reference voltage VR and, therefore, are unstably turned on, the global data bus GIO is charged by the receivers RX and QRX during discharge in response to the drive pulses DP1 and DP2. Therefore, sizes of the NMOS transistors N5, N6, N7, and N8 in the transmitters TX and QTX, which perform a discharge of the global data bus GIO, are sufficiently large to compensate a current charge caused by the first and the third NMOS transistors N1 and N3.

FIG. 10 is a block diagram showing a discharge procedure of the first global data bus GIO_LU in the 256M multi-port DRAM shown in FIG. 1.

As shown, the first global data bus GIO_LU of the first quadrant in the 256M multi-port DRAM is connected to the four banks BANK0, BANK2, BANK4, and BANK6, two ports PORT0 and PORT2, and the first global data bus connector PR_U. In order to transmit data through the global data bus GIO, every block connected to the global data bus GIO should include a transmitter and a receiver coupled with the global data bus GIO. That is, the bus connector TL and the data transfer unit QTRX include the receivers RX and QRX and the transmitters TX and QTX, respectively. Though not illustrated, the first global data bus connector PR_U also includes a receiver and a transmitter.

As previously mentioned, the receivers RX and QRX sense data according to a state of the global data bus GIO and are served as a charge source for charging the global data bus GIO.

Referring to FIG. 10, the third bank BANK2 transmits data; the third port PORT2 receives the data. In this case, the global data bus GIO is discharged by the transmitter TX in the third bank BANK2 while a read drive pulse RDP<2>, activated in response to the read command, is in a logic level 'H'. A period when the read drive pulse RDP<2> is in the logic level 'H' is determined by an operational speed of the memory device. If the operation speed of the memory device is very high, the period may be several nano-seconds (ns). That is, the transmitter TX in the third bank BANK2 should discharge the first global data bus GIO_LU within very short time.

Meanwhile, because the receivers RX and QRX charge the global data bus GIO even while the transmitter TX and QTX discharge the global data bus GIO, it is hard for the transmitter TX of the third bank BANK2 to effectively discharge the global data bus GIO. The abovementioned problem also occurs not only with the write operation but, also with the read operation.

In order to solve the abovementioned problem, it is required that sizes of the NMOS transistors N5 to N8 in the transmitters TX and QTX are large to discharge a sufficiently large amount of an electric charge of a short time.

However, as the size of the NMOS transistor is increased, current consumption and layout size are also increased. The problems caused by increasing the size of the transistors are deepened when the number of receivers connected to a single global data bus GIO grows. Further, the problem leads to difficulty of routing operation of the global data bus GIO.

SUMMARY OF THE INVENTION

It is, therefore, an object of the present invention to provide a multi-port memory device for improving a global data drive efficiency by turning off the switches, which do not discharge a global data bus. The present invention makes it possible to minimize a layout size, facilitate a package, and increase a bandwidth without causing a skew between data lines in a data bus.

In accordance with an aspect of the present invention, there is provided a multi-port memory device including a global data bus; a plurality of banks, each bank including a current sensing transmitter and a current sensing receiver for exchanging data with the global data bus; a multiplicity of ports, each including a current sensing transmitter and a current sensing receiver for exchanging data with the global data bus; a large number of switches, provided between the receivers of the banks and the ports and the global data bus, for selectively connecting the receivers to the global data bus; and a switch signal generator for generating a switch signal in response to data drive pulses inputted to the transmitters of the banks and the ports.

In accordance with another aspect of the present invention, there is provided a multi-port memory device including: a global data bus; a plurality of banks, each including a current sensing transmitter and a current sensing receiver, the transmitter and the receiver for exchanging data with the global data bus; a plurality of ports, each including the transmitter and the receiver; a plurality of switches, each switch provided between the receivers and the global data bus, the switch for selectively connecting the corresponding receiver to the global data bus; and a switch signal generator for generating a switch signal in response to a drive pulse inputted to the transmitters, wherein the switch signal turns off the switch corresponding to the receiver in the bank while the corresponding transmitter in the bank transmits the data to the global data bus and turns off the switch corresponding the receiver in the port while the corresponding transmitter in the port transmits the data to the global data bus.

In accordance with still another aspect of the present invention, there is provided a multi-port memory device including: a global data bus; a plurality of banks, each including a current sensing transmitter and a current sensing receiver, the transmitter and the receiver for exchanging a data with the global data bus; a plurality of ports, each including the transmitter and the receiver; a plurality of switches, each provided between the receivers and the global data bus, the switch for selectively connecting the corresponding receiver to the global data bus; and a switch signal generator for generating a switch signal in response to a drive pulse inputted to the transmitters, wherein the switch signal turns off the switches corresponding to the receivers except one receiver which actually receives the data while the transmitter transmits the data to the global data bus.

BRIEF DESCRIPTION OF THE DRAWINGS

The above and other objects and features of the present invention will become apparent from the following description of preferred embodiments taken in conjunction with the accompanying drawings, in which:

FIG. 2 is a diagram showing a relationship between a transfer bus and a segment of the conventional 256M multi-port DRAM shown in FIG. 1;

FIG. 12 is a diagram depicting a switching signal generator in accordance with an exemplary embodiment of the present invention;

DETAILED DESCRIPTION OF THE INVENTION

Hereinafter, a multi-port semiconductor memory device in accordance with the present invention will be described in detail referring to the accompanying drawings.

Figure 11:
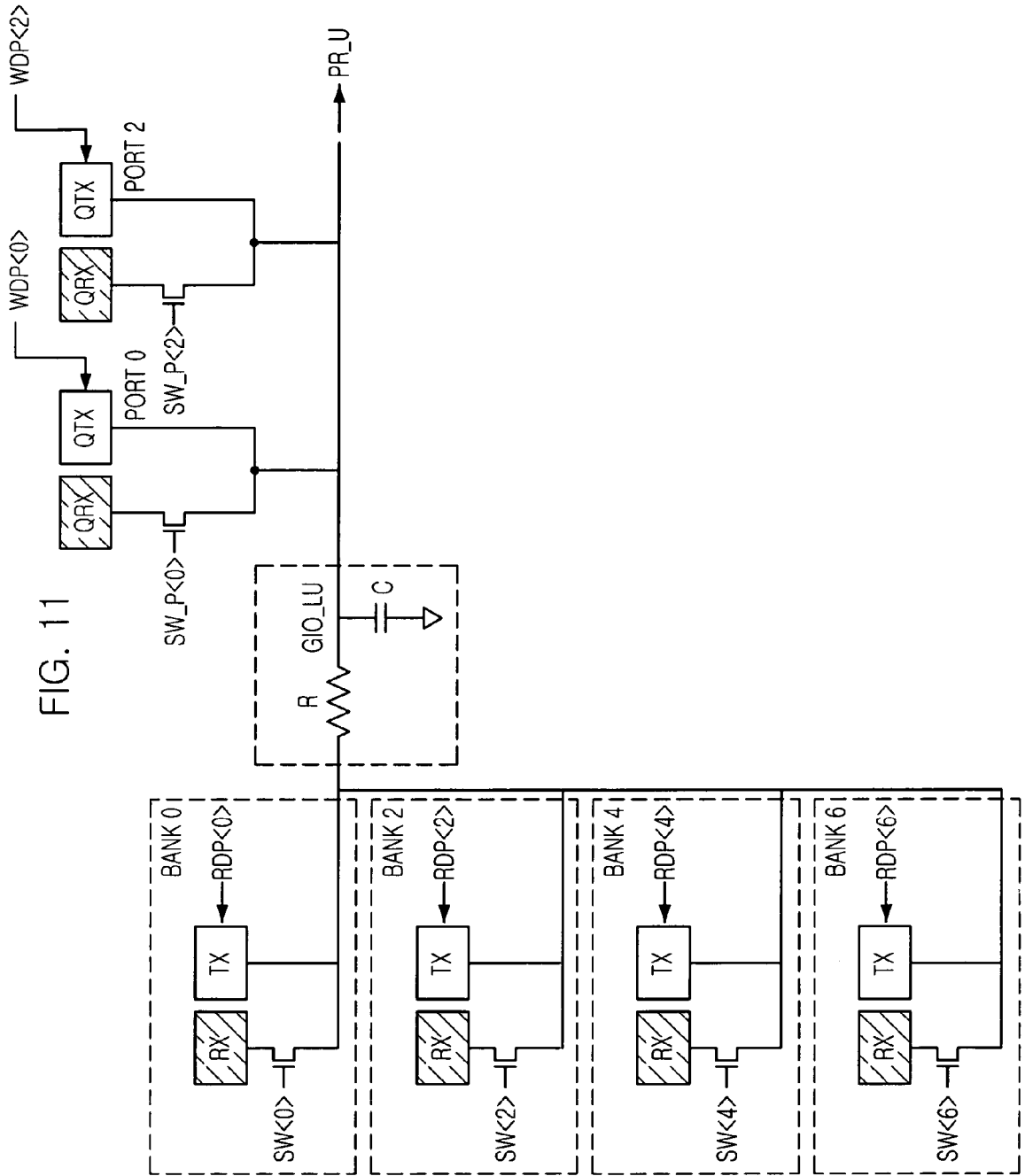
FIG. 11 is a block diagram describing a global data bus driving scheme of a 256M multi-port DRAM in accordance with a preferred embodiment of the present invention.

FIG. 11 is a block diagram describing a global data bus driving scheme of a 256M multi-port DRAM in accordance with a preferred embodiment of the present invention.

Figure 10:
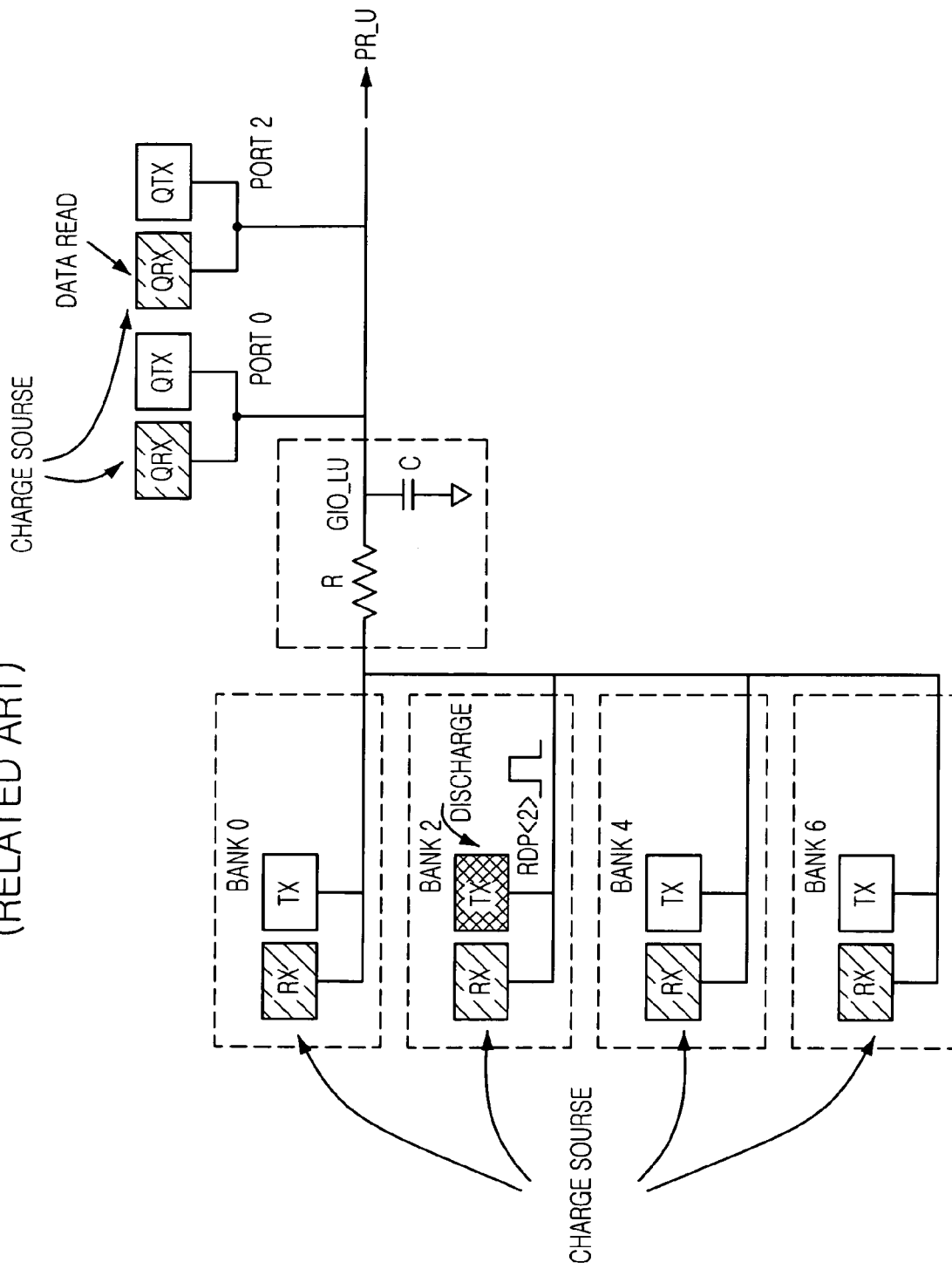
FIG. 10 is a block diagram showing a discharge procedure of the first global data bus GIO_LU in the 256M multi-port DRAM shown in FIG. 1.

As shown, compared with the conventional art shown in FIG. 10, the present invention further includes a switch NMOS transistor for performing a switching operation between a global data bus GIO_LU and receivers RX and QRX.

Each switch NMOS transistor of the receiver RX in the bus connectors TL respectively receives a switch signal SW<0>, SW<2>, SW<4>, and SW<6>. Each switch NMOS transistor of the receivers QRX in the data transfer unit QTRX receives a port switch signal SW_P<0> and SW_P<2>.

FIG. 12 is a diagram depicting a switch signal generator in accordance with an exemplary embodiment of the present invention.

As shown, the switch signal generator is provided with a first NOR gate NOR1 for receiving four read drive pulse RDP<0> to RDP<6> and a second NOR gate NOR2 for receiving two write drive pulse WDP<0> and WDP<2>.

Figure 1:
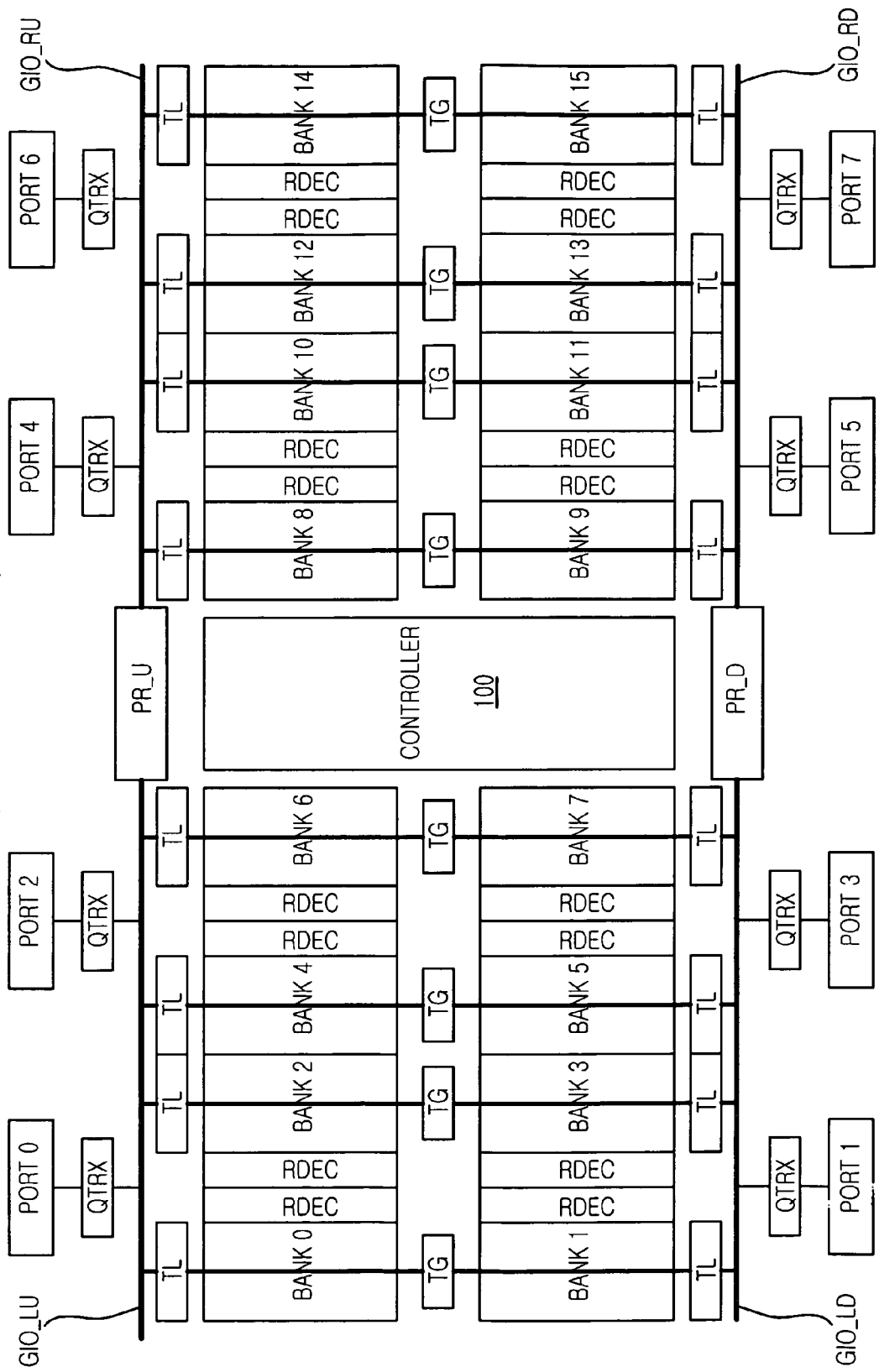
FIG. 1 is a block diagram describing a 256M multi-port memory device disclosed in a commonly owned co-pending application, U.S. Ser. No. 10/750,156, filed on Dec. 31, 2003, entitled "MULTI-PORT MEMORY DEVICE", which is incorporated herein by reference.
Figure 3A:
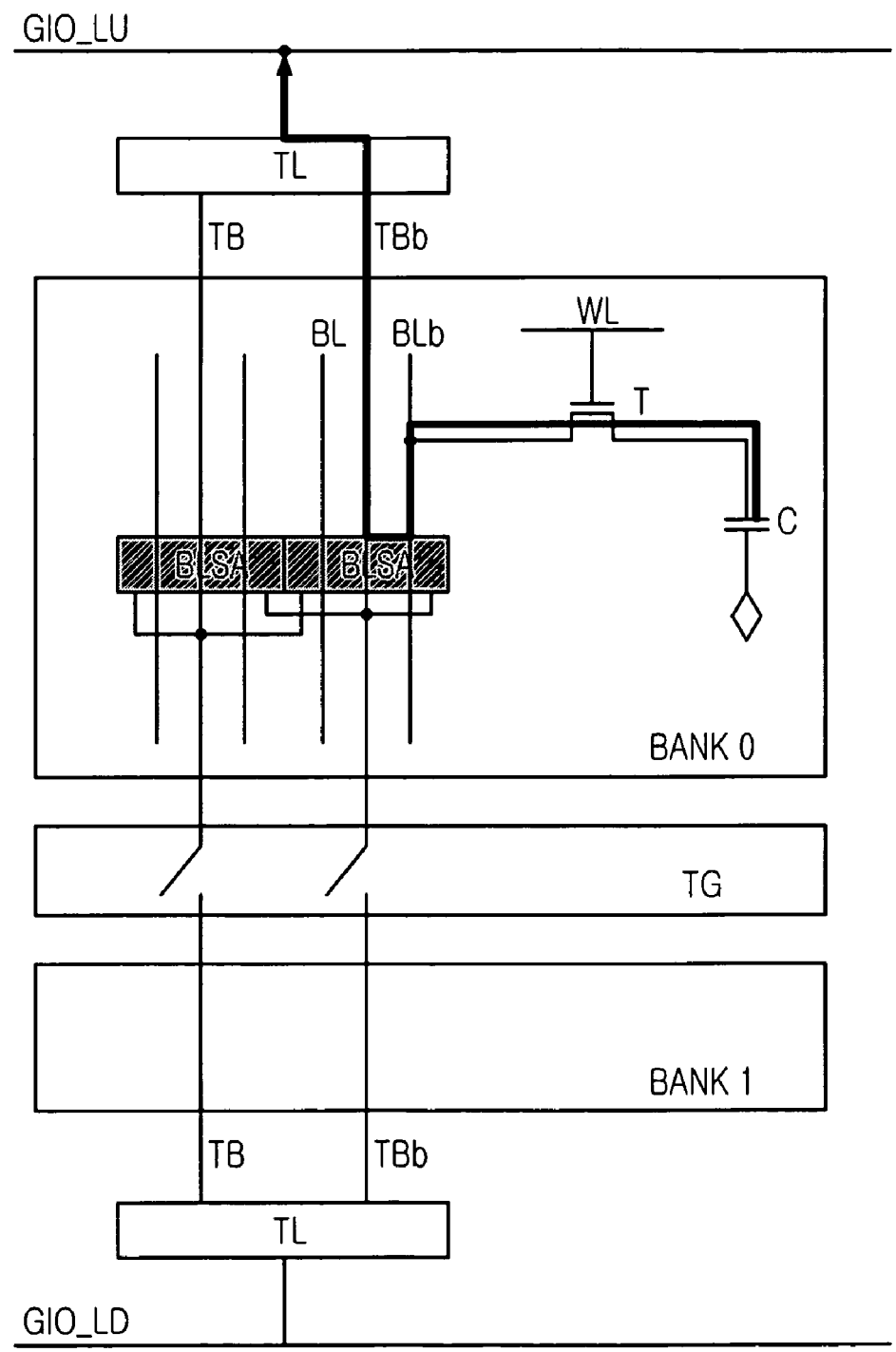
FIGS. 3A and 3B are block diagrams describing a normal read path and a normal write path of the conventional 256M multi-port DRAM, respectively.
Figure 3B:
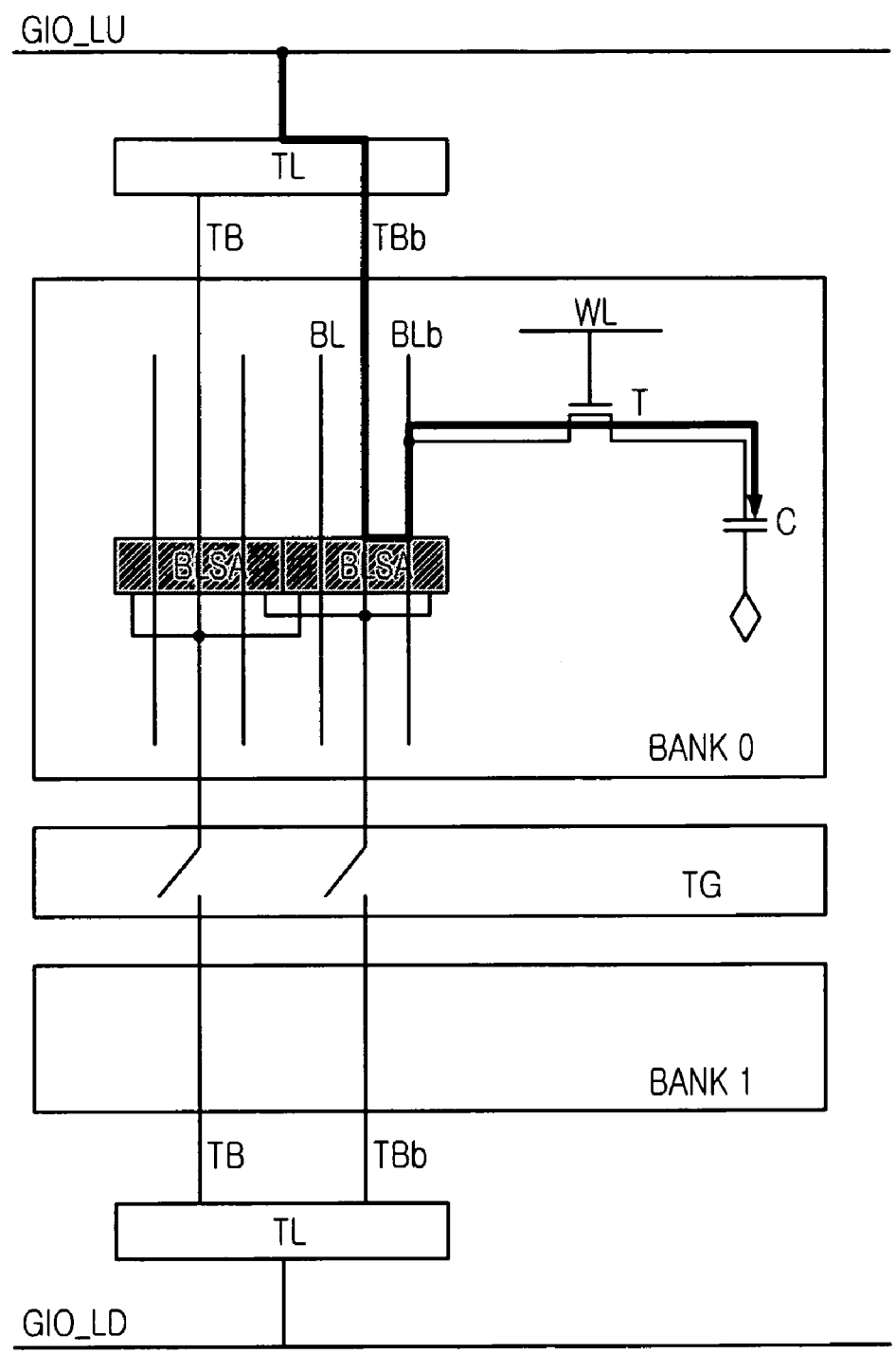
Figure 4A:
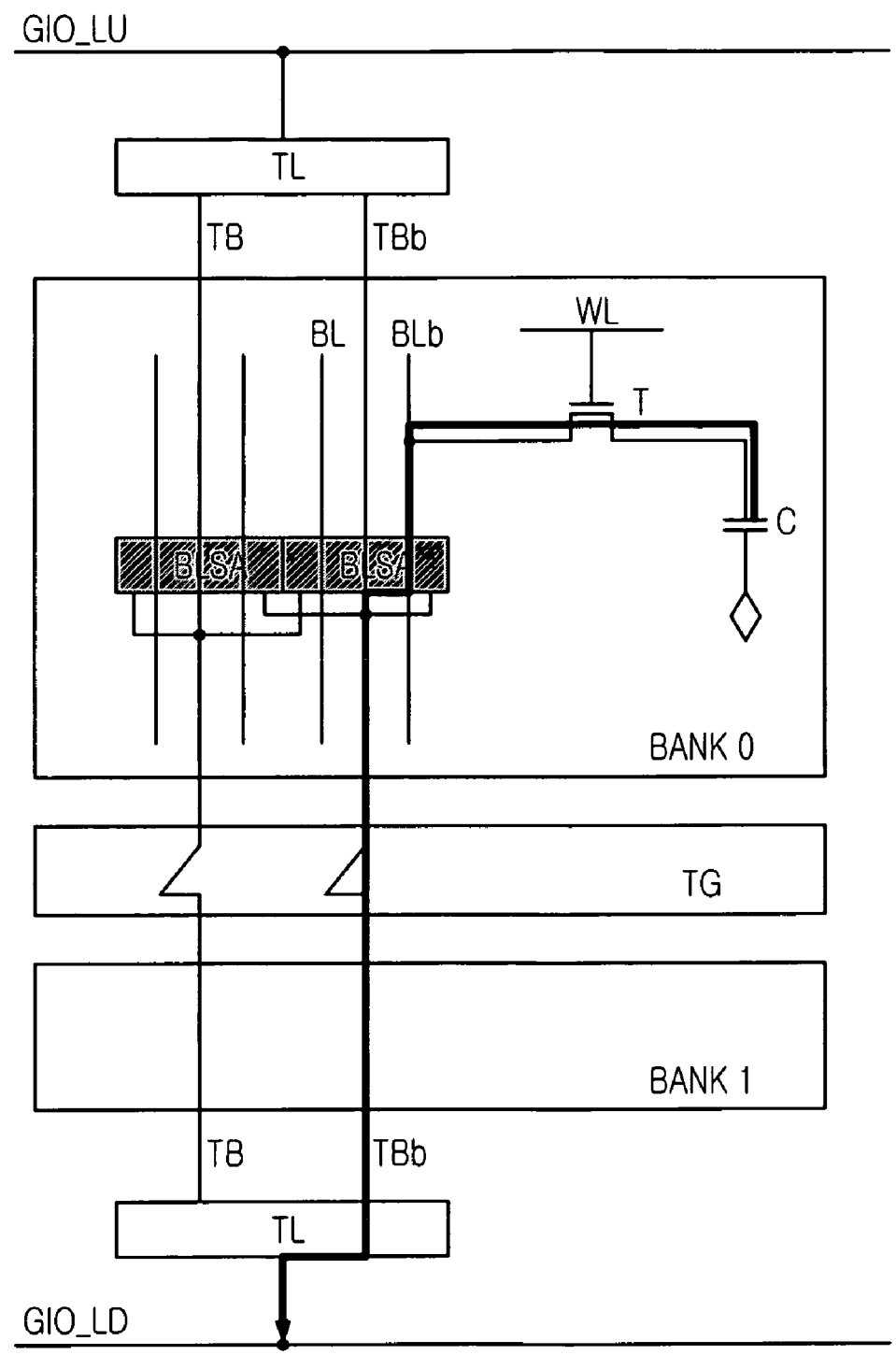
FIGS. 4A and 4B are block diagrams describing a cross read path and a cross write path of the conventional 256M multi-port DRAM, respectively.
Figure 4B:
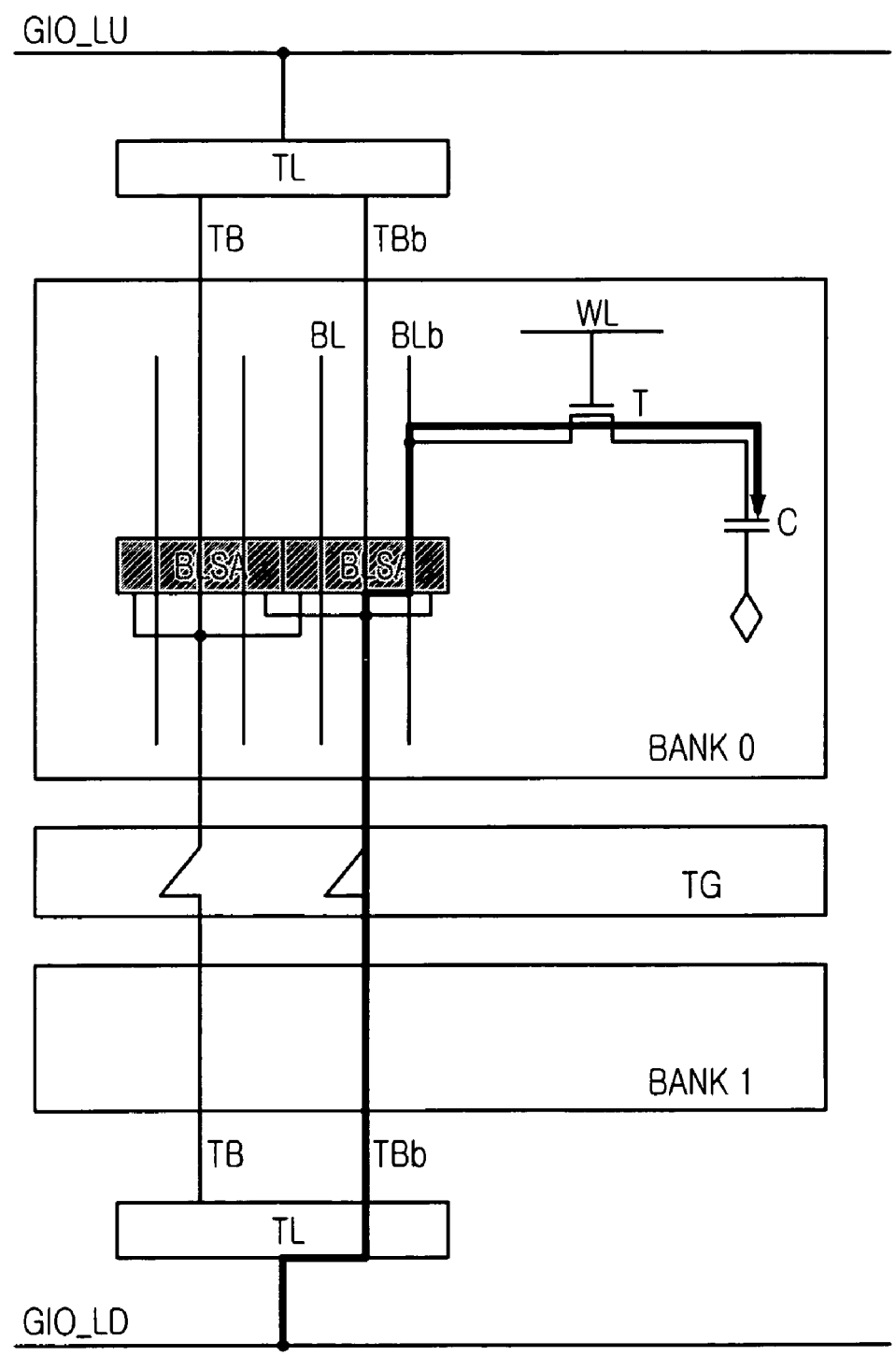
Figure 5:
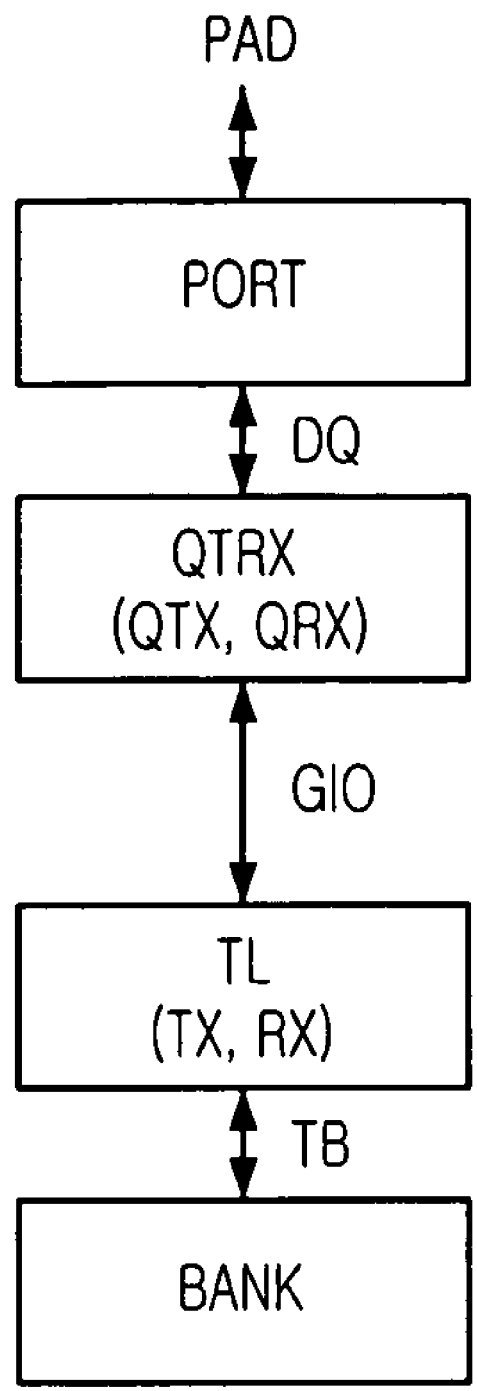
FIG. 5 is a diagram showing a data transmitting structure of the 256M multi-port DRAM shown in FIG. 1.
Figure 6:
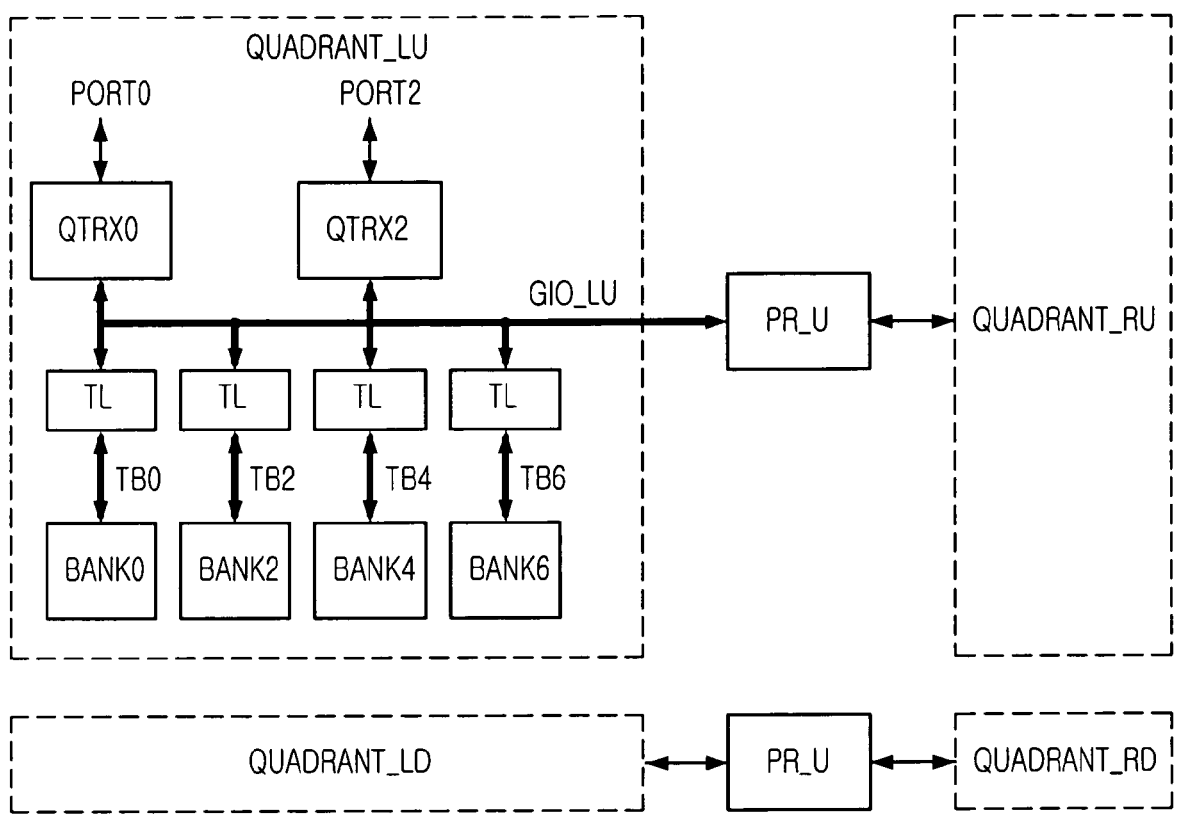
FIG. 6 is a block diagram describing a structure of the global data bus GIO shown in FIG. 5.
Figure 7:
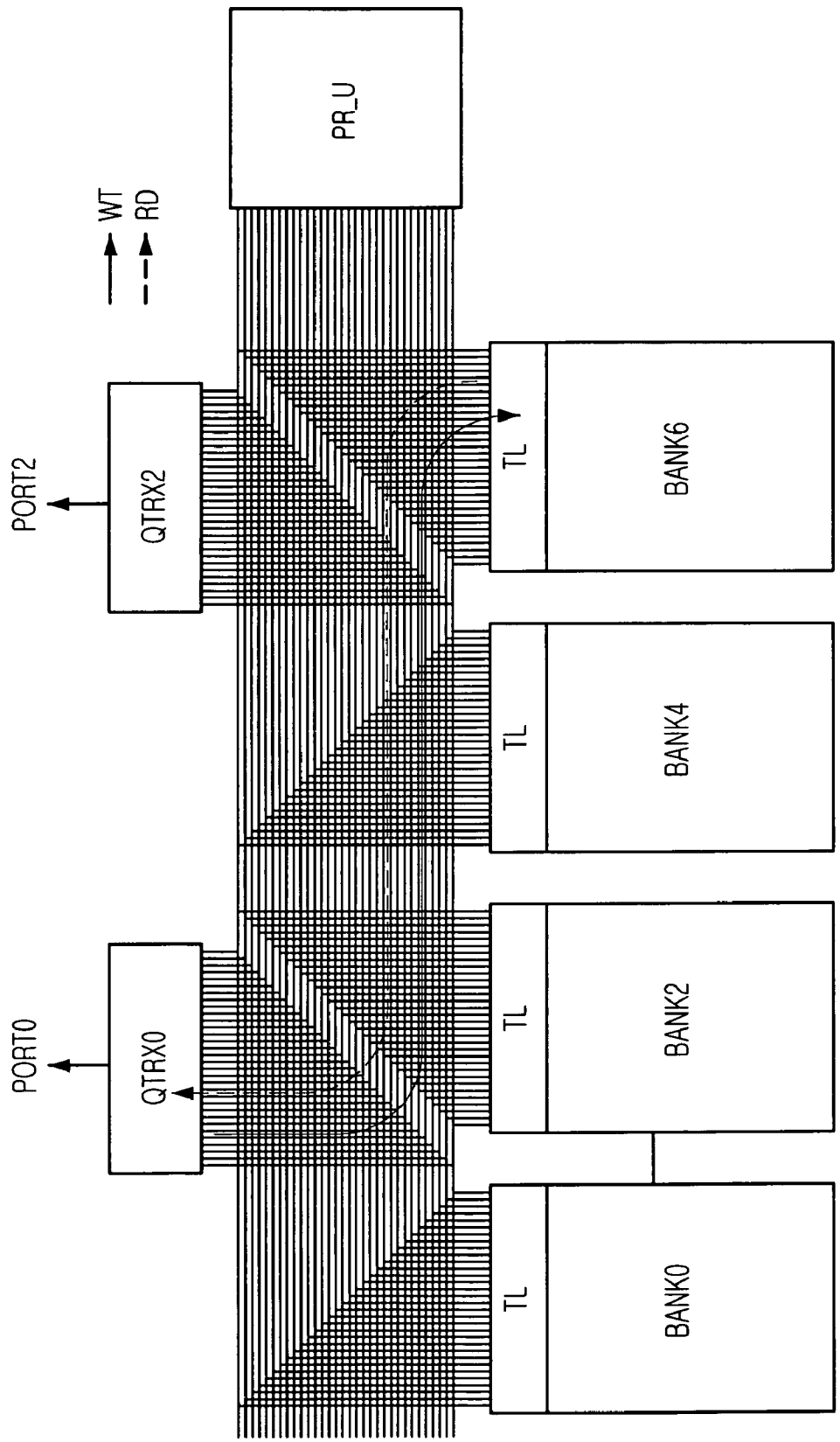
FIG. 7 is a block diagram showing a worst read case and a worst write case of the 256M multi-port DRAM shown in FIG. 1.
Figure 8:
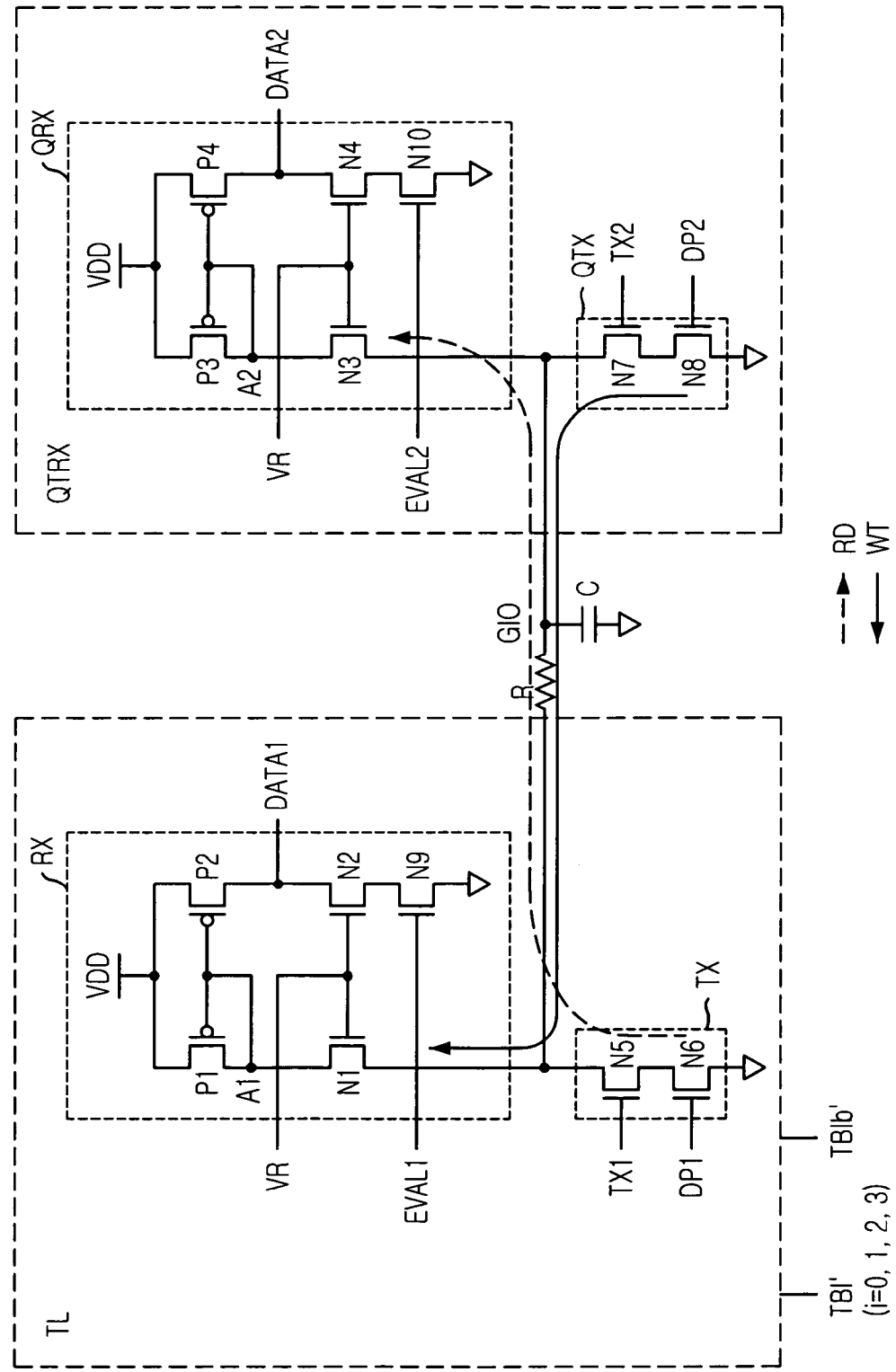
FIG. 8 is a block diagram describing a data transfer unit QTRX and bus connector TL disclosed in a commonly owned co-pending application, U.S. Ser. No. 10/788,704, filed on Feb. 27, 2004, entitled "SEMICONDUCTOR MEMORY DEVICE", which is incorporated herein by reference.
Figure 9:
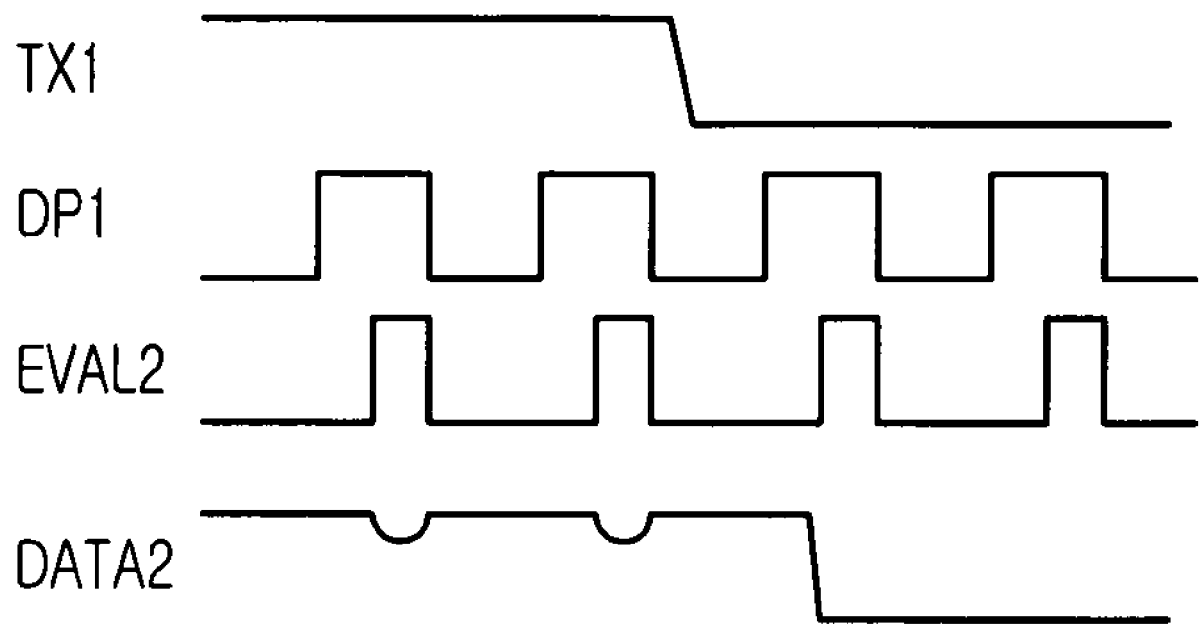
FIG. 9 is a waveform showing a read operation of the circuit shown in FIG. 8.

Herein, the read drive pulse RDP<0>, RDP<2>, RDP<4> and RDP<6> becomes logically high when a transmitter TX in a corresponding bank transmits data to a port. The write drive pulse WDP<0> and WDP<2> becomes logically high when a transmitter QTX in a corresponding port transmits data to a bank. Further, first and second drive pulses DP1 and DP2 shown in FIG. 8 are corresponding to the read drive pulse RDP<0> to RDP<6> and the write drive pulse WDP<0> and WDP<2>, respectively.

The four read drive pulses RDP<0> to RDP<6> outputted from the first NOR gate NOR1 have substantially same timing and the write two drive pulses WDP<0> and WDP<2> outputted from the second NOR gate NOR2 have substantially same timing.

Figure 13:
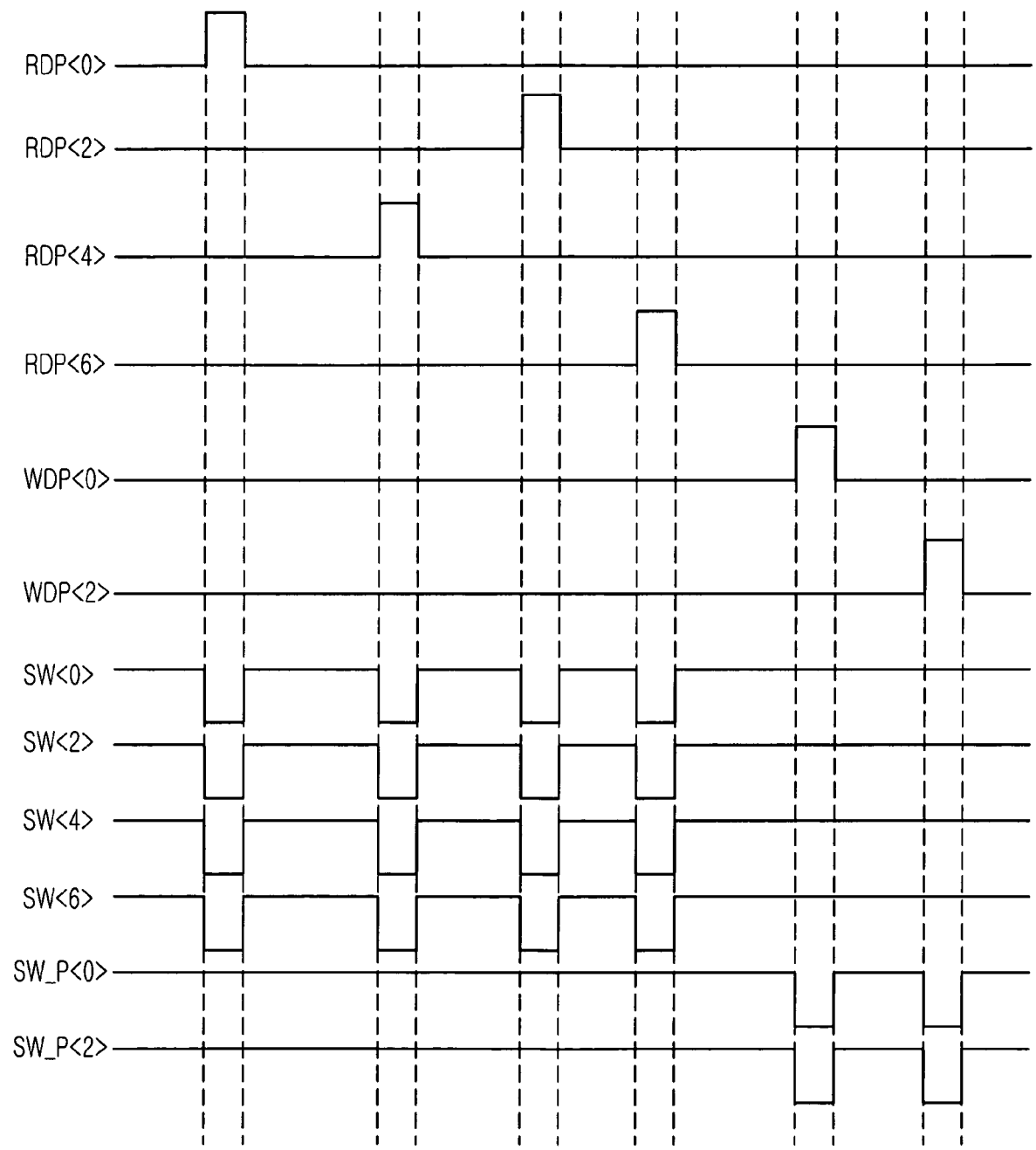
FIG. 13 is a waveform demonstrating an operation of the switching signal generator shown in FIG. 12.

FIG. 13 is a waveform demonstrating an operation of the switch signal generator shown in FIG. 12.

As above mentioned, the read drive pulse RDP<0> to RDP<6> becomes logically high when the DRAM performs a read operation. That is, when at least one of the read drive pulses RDP<0> to RDP<6> has a logic high level, the receiver QRX in the port senses the state of the global data bus GIO_LU. Therefore, whether the receivers RX in the bus connectors TL are switched off or not does not effect the read operation.

On the other hand, when the write drive pulse WDP<0> and WDP<2> have a logic high level, i.e., when the DRAM performs a write operation, the receiver RX in the bank senses the state of the global data bus GIO_LU. Consequently, whether the receivers QRX in the port are switched off or not does not effect the write operation.

Herein, when the switch signal generator is implemented only with NOR gates as shown in FIG. 12, a problem is caused by a fan-in value of the NOR gate. That is, if the fan-in value of the NOR gate is excessively increased, the size of the NOR gate is remarkably larger.

Referring to FIG. 11, two receivers QRX of port and four receivers RX in the bus connector TL are connected to the global data bus GIO_LU. Therefore, sizes of the switch NMOS transistor in the bus connectors TL and the switch NMOS transistor in the ports are different from each other. In other words, a discharge capability of the receivers RX and QRX must be different.

Figure 14:
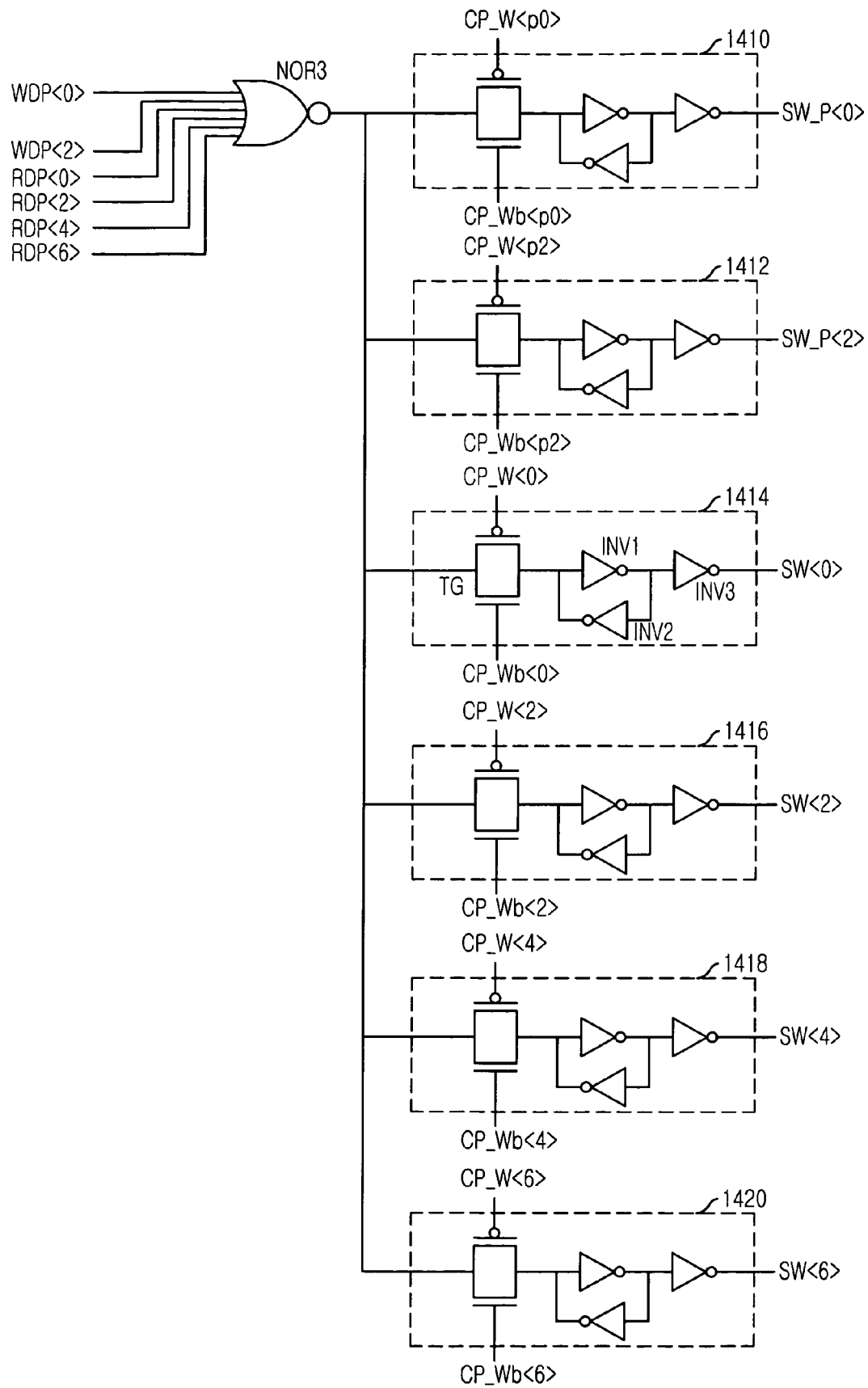
FIG. 14 is a diagram depicting a switch signal generator in accordance with an exemplary embodiment of the present invention.

FIG. 14 is a schematic circuit diagram showing a switch signal generator in accordance with another embodiment of the present invention.

As shown, the switch signal generator includes a third NOR gate NOR3 for receiving the read drive pulse RDP<0> to RDP<6> and the write drive pulse WDP<0> and WDP<2> and a plurality of latch circuits 1410 to 1420. Each latch circuit selectively latches an output of the third NOR gate NOR3 to activate the corresponding switch signal.

The latch circuit 1414 outputting the first switch signal SW<0> is provided with a transmission gate TG for selectively transmitting the output of the third NOR gate NOR3, a latch provided with two inverters INV1 and INV2, and an inverter INV3 for inverting an output of the latch to output the first switch signal SW<0>. The other latch circuits 1410, 1412, 1416, 1418, and 1420 have the substantially same structure with the latch circuit 1414.

The transmission gate TG in the latch circuit 1414 is controlled by data capture signals CP_W<0> and CP_Wb<0>. The data capture signal CP_W<0> is used for latching data sensed by the receivers RX and QRX. In this aspect, the data capture signal CP_W<0> is similar to the evaluation signal EVAL1 and EVAL2. The data capture signal CP_W is classified into a read data capture signal RCP and a write data capture signal WCP which are activated during the read operation and during the write operation, respectively.

Figure 15:
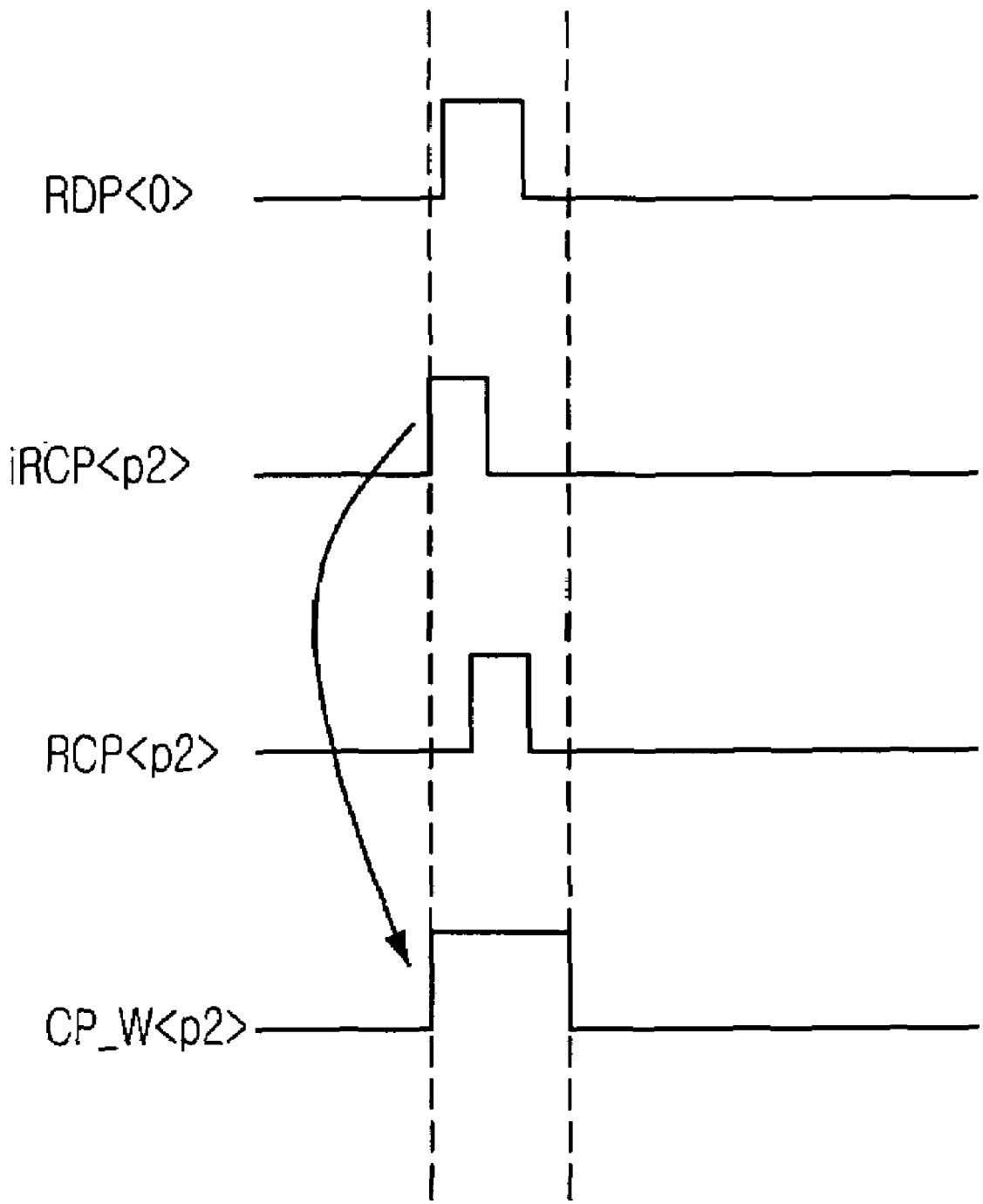
FIG. 15 is a waveform demonstrating a method for generating the data capture signal.

FIG. 15 is a waveform demonstrating a method for generating the data capture signal CP_W.

The receivers RX and QRX senses the data after the data are transmitted to the global data bus GIO_LU by the transmitters TX and QTX. That is, a phase of the data capture signal CP_W lags behind that of the drive pulse DP. Therefore, an initial data capture signal iCP_W as well as the data pulse is generated in response to the read and the write commands. The initial data capture signal iCP_W is delayed for a predetermined time to generate the data capture signal CP_W. The initial data capture signal iCP_W leads the drive pulse DP.

Referring to FIG. 14, the transmission gate TG in the latch circuit 1410 to 1420 must be opened before the output of the third NOR gate NOR are inputted to the latch circuit 1410 to 1420. Otherwise, the latch cannot latch the output of the third NOR gate NOR3 properly.

That is, the signal controlling the transmission gate TG has to lead the drive pulse DP and be activated while the data pulse DP is activated. Therefore, the signal controlling the transmission gate, i.e., the data capture signal CP_W, is required to have a wider pulse length than the drive pulse DP. In order to satisfy abovementioned requirement, the initial data capture signal iCP_W, which leads the drive pulse, is used to generate the data capture signal CP_W.

Referring to FIG. 15, the data stored in the first bank BANK0 is read through the third port PORT2. After the read drive pulse RDP<0> and the initial read data capture signal iRCP<p2> are activated in response to the read command and the address, the read data capture signal RCP<p2> is generated by delaying the initial read data capture signal iRCP<p2>. Then, by using the initial read data capture signal iRCP<p2> and the read data capture signal RCP<p2>, the data capture signal CP_W<p2>, which has a wider pulse length than the read drive pulse RDP<0> is generated.

Until any command is inputted to the switch signal generator in accordance with the above-mentioned embodiment, the output of the third NOR gate NOR3 is in a logic high level and, therefore, the transmission gate TG in all latch circuits 1410 to 1420 are opened. Therefore, each latch in the latch circuits 1410 to 1420 latches the signal of a logic high level. Consequently, the switch signals SW<0> to SW<6>, SW_P<0>, and SW_P<2> become logically high.

When one of the drive pulses WDP<0>, WDP<2>, and RDP<0> to RDP<6> transition to a logic high level in response to the read command or the write command, the output of the third NOR gate NOR3 also transition to a logic low level. Further, the data capture signal CP_W corresponding to the receiver RX and QRX which actually receives the data becomes logically high while the drive pulse DP corresponding to the transmitter TX and QTX, which actually transmits the data is activated as a logic high level. Herein, the other capture signals CP_W, i.e., which do not receive the data, holds the logic low level.

As a result, the transmission gate TG in the latch circuits 1410 to 1420 corresponding to the receivers RX and QRX, which actually receive the data is closed and, therefore, the data latched in the latch of the latch circuits is not changed. On the other hand, the transmission gate TG in the latch circuit 1410 to 1420 corresponding to the receivers RX and QRX, which do not receive the data keeps open and, therefore, the data latched in the latch of the latch circuits is changed.

Thus, the switch signal SW<0> to SW<6>, SW_P<0>, and SW_P<2> corresponding to the receiver RX and QRX, which actually receives the data holds the logic high level; and the other switch signals becomes logically low.

Thereafter, when all drive pulses WDP<0>, WDP<2>, and RDP<0> to RDP<6> and the data capture signal CP_W become logically low, all of the latch circuits 1410 to 1420 become logically high.

That is, when the switch signal generator shown in FIG. 14 is used, only the switch NMOS transistor included in the receiver RX and QRX, which actually receive the data is turned on to receive the data; and the others are turned off to disconnect the corresponding receiver RX and QRX with the global data bus GIO_LU. As a result, while the global data bus GIO_LU is discharged, only one receiver charges the global data bus GIO_LU.

Compared with the switch signal generator shown in FIG. 12, the switch signal generator shown in FIG. 14 reduces the current waste by decreasing the number of the switch NMOS transistors turned on during the read and the write operations.

In the above-mentioned embodiment, because only the switch NMOS transistor of the bank, which actually discharges the global data bus GIO, is connected to the global data bus GIO, only one charge source exists. Therefore, a sufficient charge can be achieved without increasing the size of the transistors in the transmitters TX and QTX.

In another embodiment, the present invention also can be applied to other multi-port memory devices having a RAM cell, such as a static random access memory (SRAM). Further, the number of the multi-port memory device and the banks can be varied according to a capacity of the memory device and a chip size. Transistors and logic gates used in the above-mentioned embodiment can be changed according to a polarity of signals.

The present invention provides a multi-port memory device having a global data bus which is driven by sensing a current, the multi-port memory device reduces power consumption by turning off the transistors, which does not discharge the global data bus GIO, reducing a size of the transistor performing a discharge operation, and reducing chip size.

What is claimed is:

1. A multi-port memory device, comprising:
   a global data bus;
   a plurality of banks, each including a transmitter and a receiver;
   a plurality of ports, each including a transmitter and a receiver;
   a plurality of switches that operate to selectively connect the receivers of the plurality of banks and the plurality of ports to the global data bus; and
   a switch signal generator for generating a switch signal in response to data drive pulses inputted to the transmitters of the plurality of banks and the plurality of ports,
   wherein the switch signal turns off a switch corresponding to the receiver in the port while the corresponding transmitter in the port transmits data to the global data bus.

2. The multi-port memory device as recited in claim 1, wherein the switch signal turns off a switch corresponding to the receiver in the bank while the corresponding transmitter in the bank transmits the data to the global data bus.

3. The multi-port memory device as recited in claim 2, wherein each of the plurality of switches has an NMOS transistor having a gate that receives the switch signal.

4. The multi-port memory device as recited in claim 2, wherein the switch signal generator includes:
   a first logic gate unit for logically combining a plurality of read data drive pulses inputted to the transmitters in the bank to generate a bank switch signal; and
   a second logic gate unit for logically combining a multiplicity of write data drive pulses inputted to the transmitters in the port to generate a port switch signal,
   wherein the read data drive pulses and the write data drive pulses are respectively activated in response to a read command and a write command.

5. The multi-port memory device as recited in claim 4, wherein each of the first and the second logic gate units has a NOR gate.

6. The multi-port memory device as recited in claim 2, wherein each of the transmitters of the plurality of banks and the plurality of ports is a current sensing transmitter and includes first and second NMOS transistors serially connected to each other between the global data bus and a ground voltage terminal, the first and the second NMOS transistors respectively receiving the data drive pulse and the data through their gates.

7. The multi-port memory device as recited in claim 6, wherein each of the receivers of the plurality of banks and the plurality of ports is a current sensing receiver and includes:
   a first PMOS transistor whose first terminal is connected to a power voltage terminal and second terminal and gate are diode-connected to each other;

a second PMOS transistor whose first terminal is connected to the power voltage terminal and second terminal is connected to an output terminal;

a third NMOS transistor having a first terminal connected to the second terminal of the first PMOS transistor, a second terminal connected to the global data bus, and a gate receiving a reference voltage;

a fourth NMOS transistor whose first terminal is connected to the output terminal and gate receives the reference voltage; and a fifth NMOS transistor having a first terminal connected to a second terminal of the fourth NMOS transistor, a second terminal connected to the ground voltage, and a gate receiving an evaluation signal.

8. The multi-port memory device as recited in claim 1, wherein the switch signal turns off the switches corresponding to the receivers in the plurality of banks except one receiver in the plurality of the banks which actually receives data while one transmitter in the plurality of banks transmits data to the global data bus.

9. The multi-port memory device as recited in claim 8, wherein each of the switches has an NMOS transistor having a gate that receives the switch signal.

10. The multi-port memory device as recited in claim 8, wherein the switch signal generator includes:

a logical combining block for logically combining the data drive pulses corresponding to all of the transmitters in the plurality of banks and the plurality of ports; and a plurality of latch circuits for selectively latching an output of the logical combining block while the global data bus is driven to activate one switch signal corresponding to the one receiver in the plurality of banks which actually receives the data.

11. The multi-port memory device as recited in claim 10, wherein the logical combining block has a NOR gate for receiving the data drive pulses corresponding to all of the transmitters in the plurality of banks and the plurality of ports.

12. The multi-port memory device as recited in claim 11, wherein each latch circuit includes:

a transmission gate for selectively transmitting the output of the logical combining block in response to a capture signal whose phase leads that of the data drive pulse and pulse length is wider than that of the data drive pulse;

a latch for inverting and latching an output of the transmission gate; and an inverter for inverting an output of the latch to output the switch signal, wherein the capture signal is used for latching the data sensed by the transmitters in the plurality of banks.

13. The multi-port memory device as recited in claim 8, wherein each of the transmitters in the plurality of banks and the plurality of ports includes first and second NMOS transistors serially connected to each other between the global data bus and a ground voltage terminal, the first and the second NMOS transistors respectively receiving the data drive pulse and the data through their gates.

14. The multi-port memory device as recited in claim 13, wherein each of the receivers in the plurality of banks and the plurality of ports includes:

a first PMOS transistor whose first terminal is connected to a power voltage terminal and second terminal and gate are diode-connected to each other;

a second PMOS transistor whose first terminal is connected to the power voltage terminal and second terminal is connected to an output terminal;

a third NMOS transistor having a first terminal connected to the second terminal of the first PMOS transistor, a second terminal connected to the global data bus, and a gate receiving a reference voltage;

a fourth NMOS transistor whose first terminal is connected to the output terminal and gate receives the reference voltage; and a fifth NMOS transistor having a first terminal connected to a second terminal of the fourth NMOS transistor, a second terminal connected to the ground voltage, and a gate receiving an evaluation signal.

15. The multi-port memory device as recited in claim 1, wherein the transmitter and receiver each operate to exchange data with the global data bus, and the plurality of switches are provided between the receivers of the banks and the ports and the global data bus.

16. A multi-port memory device, comprising:

a global data bus;

a plurality of banks, each including a transmitter and a receiver;

a plurality of ports, each including a transmitter and a receiver;

a plurality of switches, that operate to selectively connect the receivers of the plurality of banks and the plurality of ports to the global data bus; and a switch signal generator for generating a switch signal in response to data drive pulses inputted to the transmitters of the plurality of banks and the plurality of ports, wherein the switch signal turns off a switch corresponding to one receiver in the bank while one corresponding transmitter in the bank transmits data to the global data bus and turns off a switch corresponding to one receiver in the port while the corresponding one transmitter in the port transmits data to the global data bus.

17. The multi-port memory device as recited in claim 16, wherein the transmitter and receiver each operate to exchange data with the global data bus, and the plurality of switches are provided between the receivers of the banks and the ports and the global data bus.

18. A multi-port memory device, comprising:

a global data bus; a plurality of banks, each including a transmitter and a receiver;

a plurality of ports, each including a transmitter and a receiver;

a plurality of switches, for selectively connecting the receivers of the plurality of banks and the plurality of ports to the global data bus; and a switch signal generator for generating a switch signal in response to data drive pulses inputted to the transmitters of the banks and the ports, wherein the switch signal turns off the switches corresponding to all of the receivers in the plurality of banks and the plurality of ports except one receiver in the plurality of banks which actually receives the data while one transmitter in the plurality of ports transmits data to the global data bus.

19. The multi-port memory device as recited in claim 18, wherein the transmitter and receiver each operate to exchange data with the global data bus, and the plurality of switches are provided between the receivers of the banks and the ports and the global data bus.

* * * * *